United States Patent
Kao et al.

(10) Patent No.: US 11,474,937 B2
(45) Date of Patent: Oct. 18, 2022

(54) COMPUTING DEVICE AND OPERATION METHOD THEREOF

(71) Applicant: NEUCHIPS CORPORATION, Hsinchu (TW)

(72) Inventors: Chao-Yang Kao, Hsinchu (TW); Youn-Long Lin, Hsinchu County (TW)

(73) Assignee: NEUCHIPS CORPORATION, Hsinchu (TW)

( * ) Notice: Subject to any disclaimer, the term of this patent is extended or adjusted under 35 U.S.C. 154(b) by 27 days.

(21) Appl. No.: 16/953,349

(22) Filed: Nov. 20, 2020

(65) Prior Publication Data
US 2022/0121565 A1    Apr. 21, 2022

(30) Foreign Application Priority Data

Oct. 16, 2020 (TW) .................................. 109135845

(51) Int. Cl.
| | |
|---|---|
| *G06F 12/02* | (2006.01) |
| *G06F 9/50* | (2006.01) |
| *G06F 13/16* | (2006.01) |
| *H03K 19/17728* | (2020.01) |

(52) U.S. Cl.
CPC ........ *G06F 12/0292* (2013.01); *G06F 9/5016* (2013.01); *G06F 9/5083* (2013.01); *G06F 12/0238* (2013.01); *G06F 13/1668* (2013.01); *H03K 19/17728* (2013.01)

(58) Field of Classification Search
None
See application file for complete search history.

(56) References Cited

U.S. PATENT DOCUMENTS

| | | | |
|---|---|---|---|
| 10,684,966 B1 * | 6/2020 | Hamman ............ | G06F 13/1668 |
| 2013/0185482 A1 | 7/2013 | Kim et al. | |
| 2019/0251043 A1 * | 8/2019 | Park .................... | G06F 11/3409 |
| 2020/0310983 A1 * | 10/2020 | Byun .................... | G06F 12/121 |

FOREIGN PATENT DOCUMENTS

| | | |
|---|---|---|
| CN | 103650054 | 3/2014 |
| TW | 201401051 | 1/2014 |

* cited by examiner

*Primary Examiner* — Charles J Choi
(74) *Attorney, Agent, or Firm* — JCIPRNET (57) ABSTRACT

A computing device and an operation method thereof are provided. The computing device includes multiple memories and an indexer circuit. The indexer circuit is separately coupled to the memories through multiple memory channels. The indexer circuit determines an arrangement of at least one lookup table to at least one of the memories according to a characteristic of the at least one lookup table and a transmission bandwidth of the memory channels, so as to balance a transmission load of the memory channels.

22 Claims, 4 Drawing Sheets

COMPUTING DEVICE AND OPERATION METHOD THEREOF

CROSS-REFERENCE TO RELATED APPLICATION

This application claims the priority benefit of Taiwan application serial no. 109135845, filed on Oct. 16, 2020. The entirety of the above-mentioned patent application is hereby incorporated by reference herein and made a part of this specification.

BACKGROUND

Technical Field

The disclosure relates to an electronic device, and particularly relates to a computing device and an operation method thereof.

Description of Related Art

The existing computing device often uses one or more lookup tables. A processor of the computing device loads the lookup table to a specific memory, and reads the content of the lookup table from the memory through a memory channel during the calculation process. Generally speaking, the speed of the table lookup usually depends on the transmission bandwidth of the memory channel.

However, during the process of processor calculation and table lookup, the number of times and the probability that different lookup tables need to be looked up are different. For example, some lookup tables are frequently looked up while some lookup tables are rarely looked up. In addition, the amount of data returned by different lookup tables for each lookup is also different. For example, some lookup tables occupy a huge transmission bandwidth of memory channels due to the large amount of data returned. Therefore, since the current computing device does not consider the characteristic of the lookup table, it is easy to cause some memory channels to be busy while some memory channels are idle when performing table lookup. Therefore, the transmission bandwidth of each memory channel cannot be effectively utilized, and the performance of the overall computing device also cannot be optimized.

It should be noted that the content of the "Description of Related Art" section is used to help understand the disclosure. Part of the content (or all of the content) disclosed in the "Description of Related Art" section may not be the conventional technology known to persons skilled in the art. The content disclosed in the "Description of Related Art" section does not represent that the content is already known to persons skilled in the art before the application of the disclosure.

SUMMARY

The disclosure provides a computing device and an operation method thereof to access a lookup table in multiple memories through multiple memory channels, and to balance the transmission load of the memory channels.

In an embodiment of the disclosure, the computing device includes multiple memories and an indexer circuit. The indexer circuit is separately coupled to the memories through multiple memory channels. The indexer circuit determines an arrangement of at least one lookup table to at least one of the memory channels according to a characteristic of the at least one lookup table and a transmission bandwidth of the memory channels, so as to balance a transmission load of the memory channels.

In an embodiment of the disclosure, the operation method includes the following steps. An indexer circuit determines an arrangement according to a characteristic of at least one lookup table and a transmission bandwidth of multiple memory channels. The indexer circuit is separately coupled to the memories through the memory channels. The indexer circuit arranges the at least one lookup table to at least one of the memories according to the arrangement, so as to balance a transmission load of the memory channels.

Based on the above, in some embodiments, the indexer circuit may determine the arrangement of at least one lookup table to at least one of multiple memories according to the characteristic of at least one lookup table and the transmission bandwidth of multiple memory channels, so as to balance the transmission load of the memory channels. Therefore, based on the balance of the transmission load (such as lookup amount or data transmission amount) of each memory channel, the utilization of the transmission bandwidth of each memory channel is maximized to reduce the time for the processor to wait for table lookup during the calculation process, thereby achieving the optimization of the performance of the overall computing device.

In order for the features and advantages of the disclosure to be more comprehensible, specific embodiments are described in detail below in conjunction with the accompanying drawings.

DETAILED DESCRIPTION OF DISCLOSED EMBODIMENTS

The term "coupling (or connection)" used in the entire specification (including the claims) of the present application may refer to any direct or indirect connection means. For example, if a first device is described as being coupled (or connected) to a second device, it should be interpreted that the first device may be directly connected to the second device or the first device may be indirectly connected to the second device through another device or certain connection means. Terms such as "first", "second", etc. mentioned in the entire specification (including the claims) of the present application are used to name the elements or to distinguish between different embodiments or ranges, but not to limit the upper limit or lower limit of the number of elements or to limit the sequence of the elements. In addition, wherever possible, elements/components/steps using the same reference numerals in the drawings and embodiments represent the same or similar parts. Relevant descriptions in different embodiments may be made with reference to each other for elements/components/steps using the same reference numerals or using the same terminologies.

Figure 1:
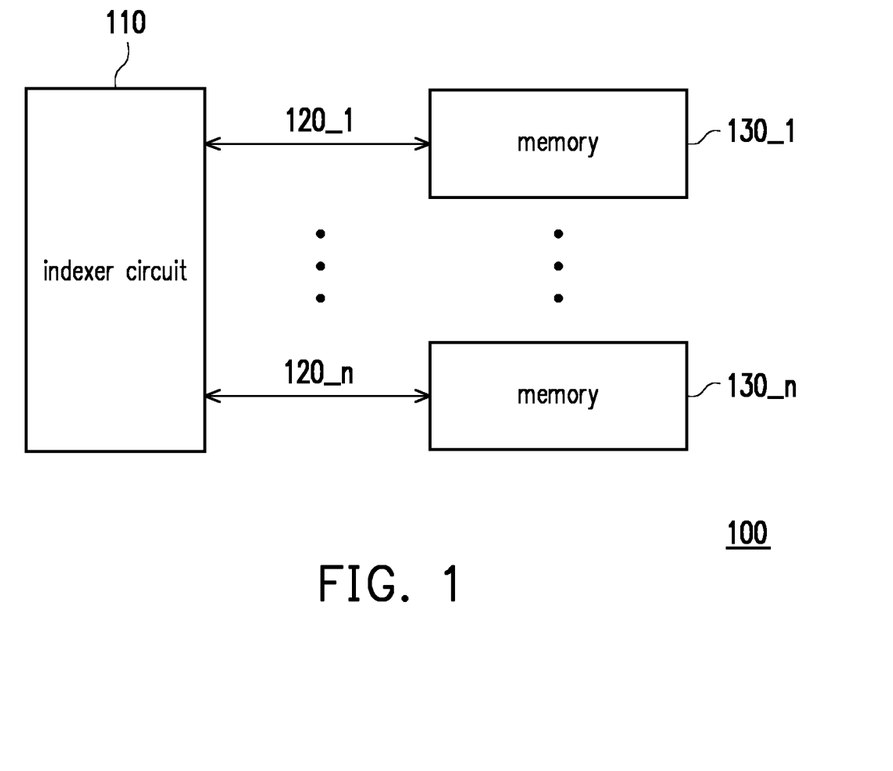
FIG. 1 is a schematic diagram of a circuit block of a computing device according to an embodiment of the disclosure.

FIG. 1 is a schematic diagram of a circuit block of a computing device 100 according to an embodiment of the disclosure. In the embodiment shown in FIG. 1, the computing device 100 includes an indexer circuit 110 and multiple memories (for example, memories 130_1, . . . , 130_n). The indexer circuit 110 is separately coupled to the memories 130_1 to 130_n through multiple memory channels (for example, memory channels 120_1, . . . , 120_n). In the embodiment, the memories 130_1 to 130_n may store at least one lookup table, the indexer circuit 110 may look up at least one lookup table from the memories 130_1 to 130_n, and the indexer circuit 110 may determine an arrangement of a lookup table in the memories 130_1 to 130_n. The indexer circuit 110 may determine the arrangement of the lookup table to the memory 130_1 to 130_n according to the characteristic of the lookup table and the transmission bandwidth of the memory channels 120_1 to 120_n, so as to balance the transmission load of the memory channels 120_1 to 120_n.

A number n of the memory channels 120_1 to 120_n and the memories 130_1 to 130_n may be determined according to design requirements. The bandwidths of the memory channels 120_1 to 120_n may be different (or the same). The memories 130_1 to 130_n may contain multiple types (or a single type) of memories. For example, the access speeds of the memories 130_1 to 130_n may be different (or the same, and the storage space sizes of the memories 130_1 to 130_n may be different (or the same). For example, in some embodiments, one of the memories 130_1 to 130_n may be a static random-access memory (SRAM), a dynamic random-access memory (DRAM), a magnetic random-access memory (MRAM), a magnetoresistive random-access memory (MRAM), a flash memory, or other types of memory.

Figure 2:
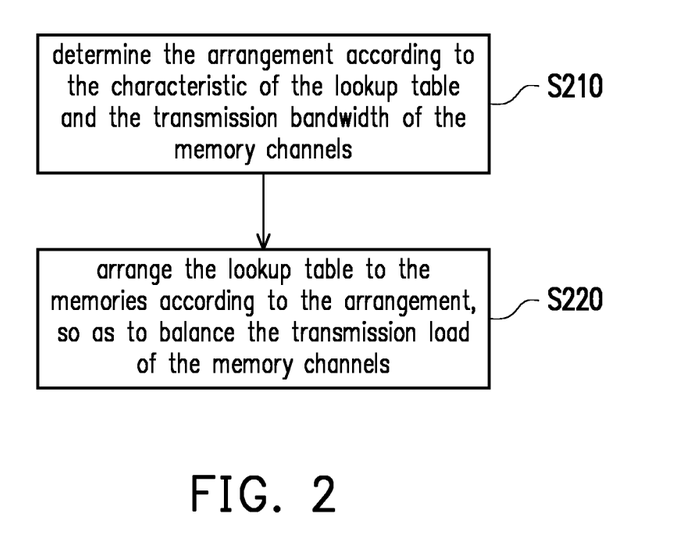
FIG. 2 is a schematic flowchart of an operation method of a computing device according to an embodiment of the disclosure.

FIG. 2 is a schematic flowchart of an operation method of a computing device according to an embodiment of the disclosure. Please refer to FIG. 1 and FIG. 2. In Step S210, the indexer circuit 110 may determine the arrangement of the lookup table to the memories 130_1 to 130_n according to the characteristic of the lookup table and the transmission bandwidth of the memory channels 120_1 to 120_n. For example, according to design requirements, the characteristic of the lookup table includes at least one of a read count, a read probability, and an amount of data returned of the lookup table.

In Step S220, the indexer circuit 110 may arrange the lookup table to the memories 130_1 to 130_n according to the arrangement determined in Step S210, so as to balance the transmission load of the memory channels 120_1 to 120_n. According to the characteristic of each lookup table, the indexer circuit 110 may store multiple lookup tables through different memory channels 120_1 to 120_n and using different memories 130_1 to 130_n to maximize the utilization of the bandwidth of each memory channel 120_1 to 120_n, so as effectively improve the efficiency of table lookup.

According to design requirements, the indexer circuit 110 may determine using one or more types of arrangements to balance the transmission load of the memory channels 120_1 to 120_n. For example, in an arrangement, the indexer circuit 110 may store each of the lookup tables to a corresponding memory in the multiple memories 130_1 to 130_n according to the characteristics of multiple lookup tables and the transmission bandwidth of the memory channels 120_1 to 120_n, so as to balance the transmission load of the memory channels 120_1 to 120_n.

For example, it is assumed that the lookup tables that need to be accessed include Table 1, Table 2, Table 3, and Table 4. It is further assumed that when the computing device 100 is working, according to the content of the algorithm, it is known that Table 1 needs to be looked up (accessed) 40 times, Table 2 needs to be looked up (accessed) 20 times, Table 3 needs to be looked up (accessed) 10 times, and Table 4 needs to be looked up (accessed) 10 times. It is also assumed that the time required for lookup (access) by the indexer circuit 110 is 1 unit each time. Without considering the transmission bandwidth of the memory channels 120_1 to 120_n, it is assumed that Table 1 and Table 2 are placed in the memory 130_1, and Table 3 and Table 4 are placed in the memory 130_n. Therefore, the indexer circuit 110 needs to read the memory 130_1 60 times (which costs 60 units of time), and needs to read the memory 130_n 20 times (which costs 20 units of time). Since the indexer circuit 110 may read the memory 130_1 and the memory 130_n at the same time, the indexer circuit 110 needs to spend 60 units of time to complete the lookup (access) operation of Table 1 to Table 4. Without considering the transmission bandwidth of the memory channels 120_1 to 120_n, the transmission load of the memory channels 120_1 to 120_n is not balanced, so the memory 130_1 and the memory channel 120_1 become performance bottlenecks.

The example described in this paragraph will continue the assumptions of the example described in the foregoing paragraph, but the transmission bandwidth of the memory channels 120_1 to 120_n is considered. That is, the indexer circuit 110 may determine the arrangement of the lookup tables to the memories 130_1 to 130_n according to the characteristics of the lookup tables and the transmission bandwidth of the memory channels 120_1 to 120_n. The indexer circuit 110 may evenly distribute the total number of table lookup times of Table 1 to Table 4 to the two memory channels 120_1 and 120_n as much as possible. For example, the indexer circuit 110 may arrange Table 1 to the memory 130_1, and Table 2, Table 3, and Table 4 to the memory 130_n. Therefore, the indexer circuit 110 needs to read the memory 130_1 40 times (which costs 40 units of time), and needs to read the memory 130_n 40 times (which costs 40 units of time). Since the indexer circuit 110 may read the memory 130_1 and the memory 130_n at the same time, the indexer circuit 110 only needs 40 units of time to complete the lookup (access) operation of Table 1 to Table 4. Compared with the example described in the foregoing paragraph, the lookup (access) operation of the example described in this paragraph is faster.

In another arrangement, the indexer circuit 110 may copy and store each of the lookup tables to different memories in the memories 130_1 to 130_n according to the characteristics of multiple lookup tables and the transmission bandwidth of the memory channels 120_1 to 120_n, so as to balance the transmission load of the memory channels 120_1 to 120_n. Since the memories 130_1 to 130_n all have the same lookup table content, the indexer circuit 110 may dynamically select which one (or which) of the memory channels 120_1 to 120_n according to the current transmission load of the memory channels 120_1 to 120_n to look up (access) the same lookup table. Therefore, the indexer circuit 110 may balance the transmission load of the memory channels 120_1 to 120_n.

In another arrangement, one of the multiple lookup tables may be divided into multiple parts, and the indexer circuit 110 may separately store the parts to different memories in the memories 130_1 to 130_n according to the characteristics of the parts and the transmission bandwidth of the memory channels 120_1 to 120_n, so as to balance the transmission load of the memory channels 120_1 to 120_n.

For example, it is assumed that the lookup tables that need to be accessed include Table 1, Table 2, Table 3, and Table 4. It is further assumed that when the computing device 100 is working, according to the content of the algorithm, it is known that 5 sets of data (A, B, C, D, and E) are read from Table 1, 2 sets of data (F and G) are read from Table 2, 2 sets of data (H and I)) are read from Table 3, and 1 set of data (J) is read from Table 4. It is also assumed that the time required for lookup (access) by the indexer circuit 110 is 1 unit each time. Without considering the transmission bandwidth of the memory channels 120_1 to 120_n, it is assumed that Table 1 and Table 2 are placed in the memory 130_1, and Table 3 and Table 4 are placed in the memory 130_n. Therefore, the indexer circuit 110 needs to read the memory 130_1 7 times (which costs 7 units of time to read the data A, B, C, D, E, F, and G), and needs to read the memory 130_n 3 times (which costs 3 units of time to read the data H, I, and J). Since the indexer circuit 110 may read the memory 130_1 and the memory 130_n at the same time, the indexer circuit 110 needs to spend 7 units of time to complete the lookup (access) operation of Table 1 to Table 4. Without considering the transmission bandwidth of the memory channels 120_1 to 120_n, the transmission load of the memory channels 120_1 to 120_n is not balanced, so the memory 130_1 and the memory channel 120_1 become performance bottlenecks.

The example described in this paragraph will continue the assumptions of the example described in the foregoing paragraph, but consider the transmission bandwidth of the memory channels 120_1 to 120_n. That is, the indexer circuit 110 may determine the arrangement of the lookup tables to the memories 130_1 to 130_n according to the characteristics of the lookup tables and the transmission bandwidth of the memory channels 120_1 to 120_n. The indexer circuit 110 may evenly distribute the total number of table lookup times of Table 1 to Table 4 to the two memory channels 120_1 and 120_n as much as possible. For example, the indexer circuit 110 may arrange the data A, B, and C of Table 1 to the memory 130_1, arrange the data D and E of Table 1 to the memory 130_n, arrange the data F of Table 2 to the memory 130_1, arrange the data G of Table 2 to the memory 130_n, arrange the data H of Table 3 to the memory 130_1, arrange the data I of Table 3 to the memory 130_n, and arrange the data J of Table 4 to the memory 130_n. Therefore, the indexer circuit 110 needs to read the memory 130_1 5 times (which costs 5 units of time to read the data A, B, C, F, and H), and needs to read the memory 130_n 5 times (which costs 5 units of time to read the data D, E, G, I and J). Since the indexer circuit 110 may read the memory 130_1 and the memory 130_n at the same time, the indexer circuit 110 only needs 5 units of time to complete the lookup (access) operation of Table 1 to Table 4. Compared with the example described in the foregoing paragraph, the lookup (access) operation of the example described in this paragraph is faster.

Based on the above, the computing device 100 of the embodiment may determine the arrangement of at least one lookup table to at least one of the memories 130_1 to 130_n according to the characteristic of the at least one lookup table and the transmission bandwidth of the memory channels 120_1 to 120_n through the indexer circuit 110, so as to balance the transmission load of the memory channels 120_1 to 120_n. The computing device 100 may maximize the utilization of the bandwidth of each memory channel 120_1 to 120_n while taking into account the access speed, access power consumption, storage cost, etc., to perform the most efficient lookup table arrangement, so as to effectively improve the efficiency of table lookup, thereby achieving the optimization of the performance of the computing device 100.

Figure 3:
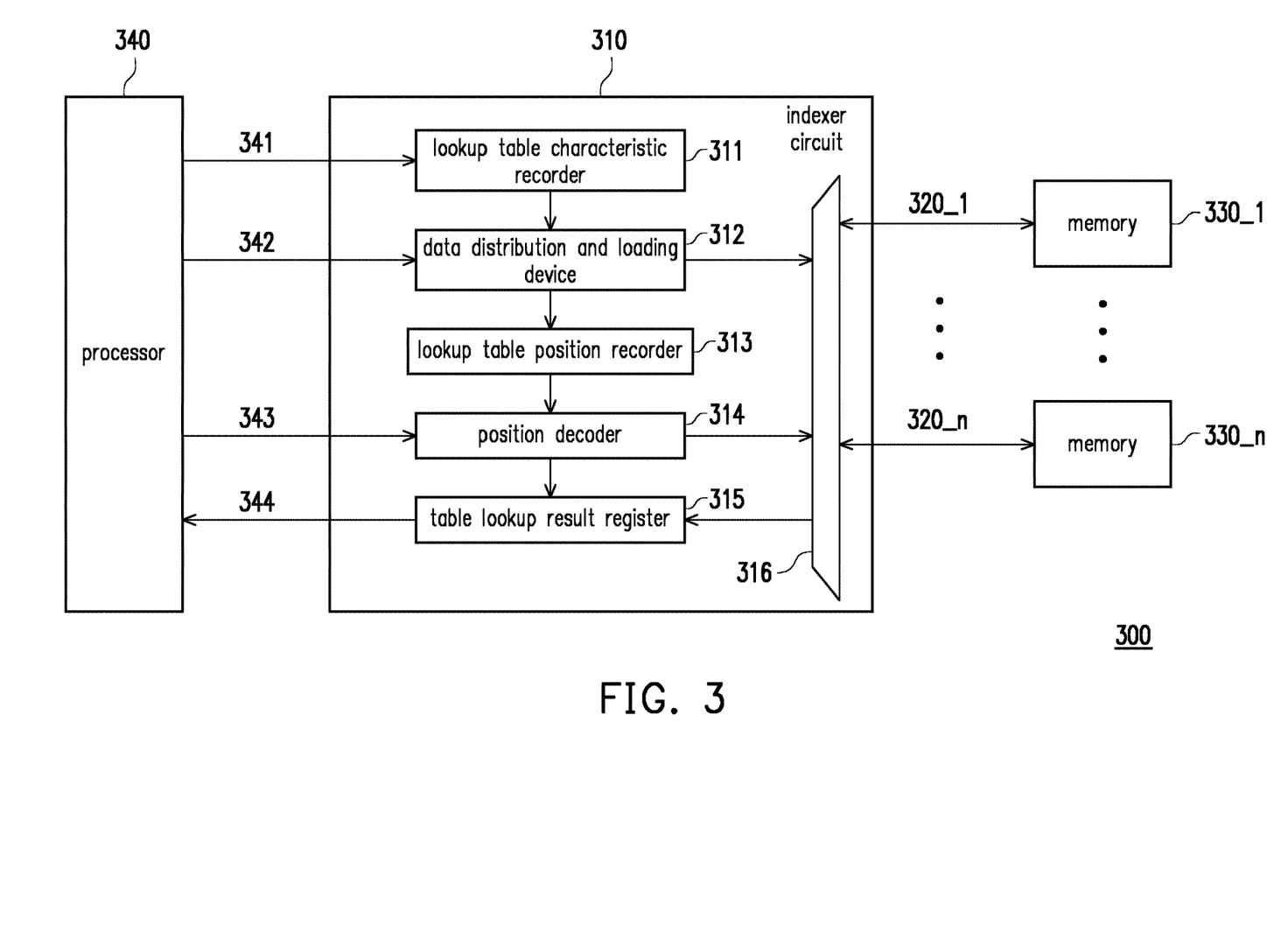
FIG. 3 is a schematic diagram of a circuit block illustrating a computing device according to another embodiment of the disclosure.

FIG. 3 is a schematic diagram of a circuit block illustrating a computing device 300 according to another embodiment of the disclosure. The computing device 300 shown in FIG. 3 includes a processor 340, an indexer circuit 310, and multiple memories (for example, memories 330_1, . . . , 330_n). The indexer circuit 310 may be separately coupled to the memories 330_1 to 330_n through multiple memory channels (for example, memory channels 320_1, . . . , 320_n). The computing device 300, the indexer circuit 310, the memory channels 320_1 to 320_n, and the memories 330_1 to 330_n shown in FIG. 3 may be analogized by referring to the relevant descriptions of the computing device 100, the indexer circuit 110, the memory channels 120_1 to 120_n, and the memories 130_1 to 130_n shown in FIG. 1, so there will be no reiteration here. In a first mode, the processor 340 may provide a lookup table 342 and a characteristic 341 thereof to the indexer circuit 310. In a second mode, the processor 340 may send a table lookup request 343 to the indexer circuit 310, and then read a table lookup result 344 from the indexer circuit 310.

In the embodiment shown in FIG. 3, the indexer circuit 310 includes a lookup table characteristic recorder 311, a data distribution and loading device 312, a lookup table position recorder 313, a position decoder 314, a table lookup result register 315, and a routing circuit. 316. The routing circuit 316 is separately coupled to the memories 330_1 to 330_n through the memory channels 320_1 to 320_n.

The data distribution and loading device 312 is coupled to the lookup table characteristic recorder 311, the lookup table position recorder 313, and the routing circuit 316. The processor 340 may provide the characteristic 341 of the lookup table to the lookup table characteristic recorder 311. The lookup table characteristic recorder 311 may record the characteristic 341 of at least one lookup table, and may provide information corresponding to the characteristic 341 of the at least one lookup table to the data distribution and loading device 312. The data distribution and loading device 312 is coupled to the lookup table characteristic recorder 311, so as to receive the information provided by the lookup table characteristic recorder 311. The data distribution and loading device 312 may control (or notify) the routing circuit 316 according to the information to arrange at least one lookup table 342 from the processor 340 to the memories 330_1 to 330_n through the routing circuit 316 and the memory channels 320_1 to 320_n. The lookup table position recorder 313 is coupled to the data distribution and loading device 312. The lookup table position recorder 313 may record an arrangement result (arrangement) related to "the data distribution and loading device 312 arranging the at least one lookup table 342 to the memories 330_1 to 330_n".

The lookup table position recorder 313 may provide the arrangement result (arrangement) related to "the indexer circuit 310 (data distribution and loading device 312) arranging the at least one lookup table 342 to the memories 330_1 to 330_n". The position decoder 314 is coupled to the lookup table position recorder 313, so as to obtain the arrangement result (arrangement). The position decoder 314 is coupled to the routing circuit 316 and the processor 340. The processor 340 may send the table lookup request 343 to the position decoder 314. The position decoder 314 may acquire a specific position of the lookup table corresponding to the table lookup request 343 placed in the memories 330_1 to 330_n according to the arrangement result. Then, the position decoder 314 may control (or notify) the routing circuit 316 to look up the lookup tables arranged in the memories 330_1 to 330_n through the routing circuit 316 and the memory channels 320_1 to 320_n, so as to obtain the table lookup result. The table lookup result register 315 is coupled to the routing circuit 316. The table lookup result from the memory channels 320_1-320_n may be temporarily stored in the table lookup result register 315 through the memory channels 320_1-320_n and the routing circuit 316. Therefore, the processor 340 may send the table lookup request 343 to the indexer circuit 310, and then read the table lookup result 344 from the indexer circuit 310.

Based on the above, the processor 340 may arrange the lookup table and perform table lookup through the indexer circuit 310 in different modes to maximize the utilization of the transmission bandwidth of the memory channels 320_1 to 320_n, thereby greatly improving the efficiency of table lookup. According to different design requirements, the implementation of the processor 340 and/or the indexer circuit 310 may be hardware, firmware, software (that is, program), or a combination of the three.

In terms of hardware, the blocks of the indexer circuit 110, the processor 340, the indexer circuit 310, the lookup table characteristic recorder 311, the data distribution and loading device 312, the lookup table position recorder 313, the position decoder 314, the table lookup result register 315, and/or the routing circuit 316 may be implemented in a logic circuit on an integrated circuit. The relevant functions of the indexer circuit 110, the processor 340, the indexer circuit 310, the lookup table characteristic recorder 311, the data distribution and loading device 312, the lookup table position recorder 313, the position decoder 314, the table lookup result register 315, and/or the routing circuit 316 may be implemented as hardware using hardware description languages (for example, Verilog HDL or VHDL) or other suitable programming languages. For example, the relevant functions of the indexer circuit 110, the processor 340, the indexer circuit 310, the lookup table characteristic recorder 311, the data distribution and loading device 312, the lookup table position recorder 313, the position decoder 314, the table lookup result register 315, and/or the routing circuit 316 may be implemented in one or more controllers, microcontrollers, microprocessors, application-specific integrated circuits (ASICs), digital signal processors (DSPs), field programmable logic gate arrays (FPGAs), complex programmable logic devices (CPLDs), and/or various logic blocks, modules, and circuits in other processing units.

In terms of software and/or firmware, the relevant functions of the processor circuit 340 and/or the indexer circuit 310 may be implemented as programming codes. For example, general programming languages (for example, C, C++, or assembly language) or other suitable programming languages are utilized to implement the indexer circuit 110, the processor 340, the indexer circuit 310, the lookup table characteristic recorder 311, the data distribution and loading device 312, the lookup table position recorder 313, the position decoder 314, the table lookup result register 315, and/or the routing circuit 316. The programming codes may be recorded/stored in a recording medium. The recording medium includes, for example, a read-only memory (ROM), a storage device, and/or a random-access memory (RAM). A computer, a central processing unit (CPU), a controller, a microcontroller, or a microprocessor may read from the recording medium and perform the programming codes to achieve the relevant functions. As the recording medium, a "non-transitory computer readable medium" may be used. For example, a tape, a disk, a card, a semiconductor memory, a programmable logic circuit, etc. may be used. Furthermore, the program may also be provided to the computer (or CPU) via any transmission medium (or communication network, broadcast wave, etc.). The communication network is, for example, the Internet, a wired communication, a wireless communication, or other communication media.

FIGS. 4A to 4D are schematic diagrams illustrating specific operation scenarios of the computing device 100 shown in FIG. 1 (or the computing device 300 shown in FIG. 3) according to different embodiments of the disclosure. The computing device shown in FIG. 4A includes a processor 440 and two memories 430_1 and 430_2. The processor 440 may be separately coupled to the memories 430_1 and 430_2 through memory channels 420_1 and 420_2. The memory channels 420_1 and 420_2 and the memories 430_1 and 430_2 shown in FIG. 4A may be analogized by referring to the relevant descriptions of the memory channels 120_1 to 120_n and the memories 130_1 to 130_n shown in FIG. 1, or the processor 440, the memory channels 420_1 and 420_2, and the memories 430_1 and 430_2 shown in FIG. 4A may be analogized by referring to the relevant descriptions of the processor 340, the memory channels 320_1 to 320_n, and the memories 330_1 to 330_n shown in FIG. 3, so there will be no reiteration here.

Figure 4A:
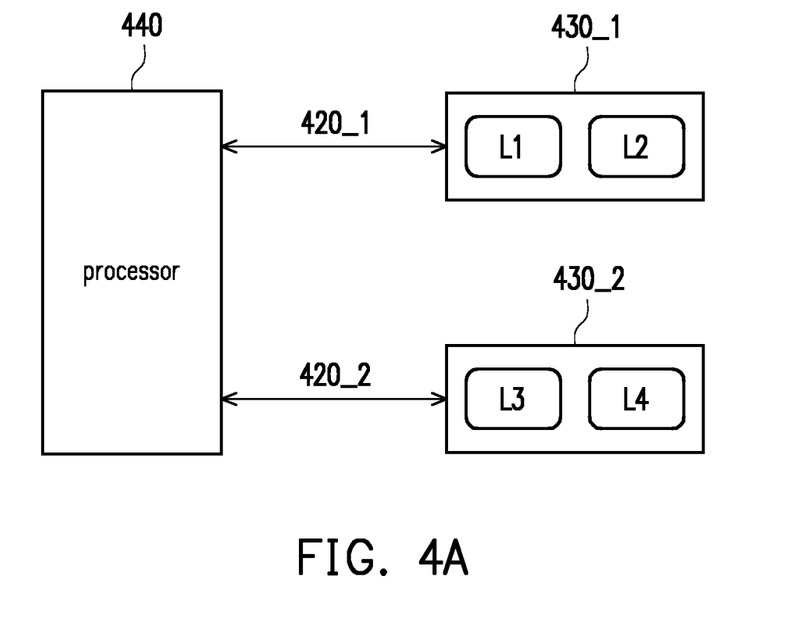
FIGS. 4A to 4D are schematic diagrams of specific operation scenarios of a computing device according to different embodiments of the disclosure.

The embodiment shown in FIG. 4A is a specific operation scenario of the computing device without considering the transmission bandwidth of the memory channels 420_1 and 420_2. For example, it is assumed that the lookup tables that need to be accessed include lookup tables L1, L2, L3, and L4. It is further assumed that when the computing device is working, according to the content of the algorithm, it is known that the table L1 needs to be looked up (accessed) 40 times, the table L2 needs to be looked up 20 times, the table L3 needs to be looked up 10 times, and the table L4 needs to be looked up 10 times. It is also assumed that the time required for lookup (access) by the indexer circuit 110 is 1 unit each time.

Without considering the transmission bandwidth of the memory channels 420_1 and 420_2, it is assumed that in the embodiment shown in FIG. 4A, the processor 440 stores the lookup tables L1 and L2 to the memory 430_1 through the memory channel 420_1, and stores the lookup table L3 and L4 to the memory 430_2 through the memory channel 420_2. Therefore, the processor 440 needs to read the memory 430_1 60 times (which costs 60 units of time), and needs to read the memory 430_2 20 times (which costs 20 units of time). Since the processor 440 may read the memory 430_1 and the memory 430_2 at the same time, the processor 440 needs to spend 60 units of time to complete the lookup (access) operation of the lookup tables L1 to L4. Without considering the transmission bandwidth of the memory channels 420_1 and 420_2, the transmission load of the memory channels 420_1 and 420_2 is not balanced, so the memory 430_1 and the memory channel 420_1 become performance bottlenecks. In other words, during the lookup process, some memory channels may be busy while some memory channels may be idle due to different characteristics of the lookup tables.

Figure 4B:
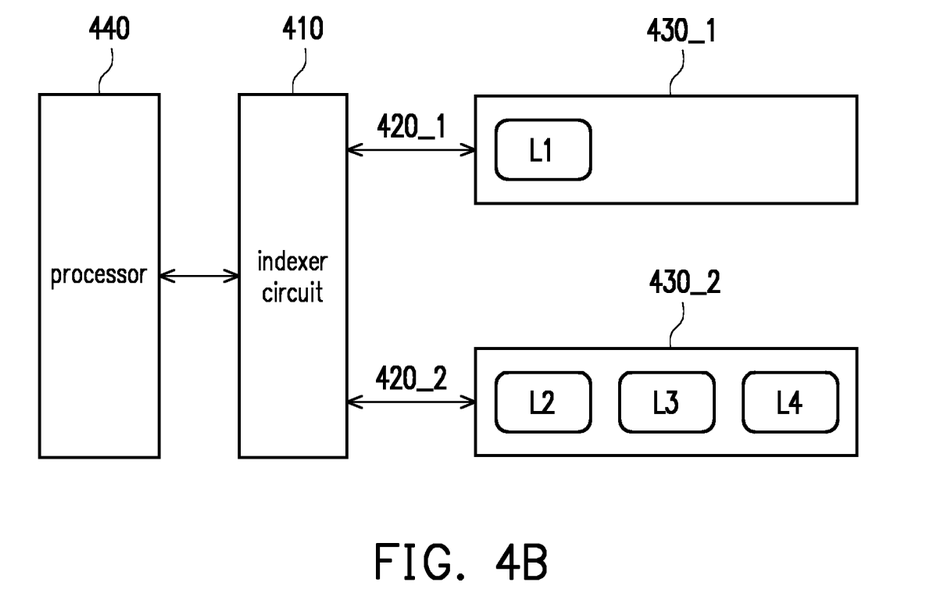
Figure 4C:
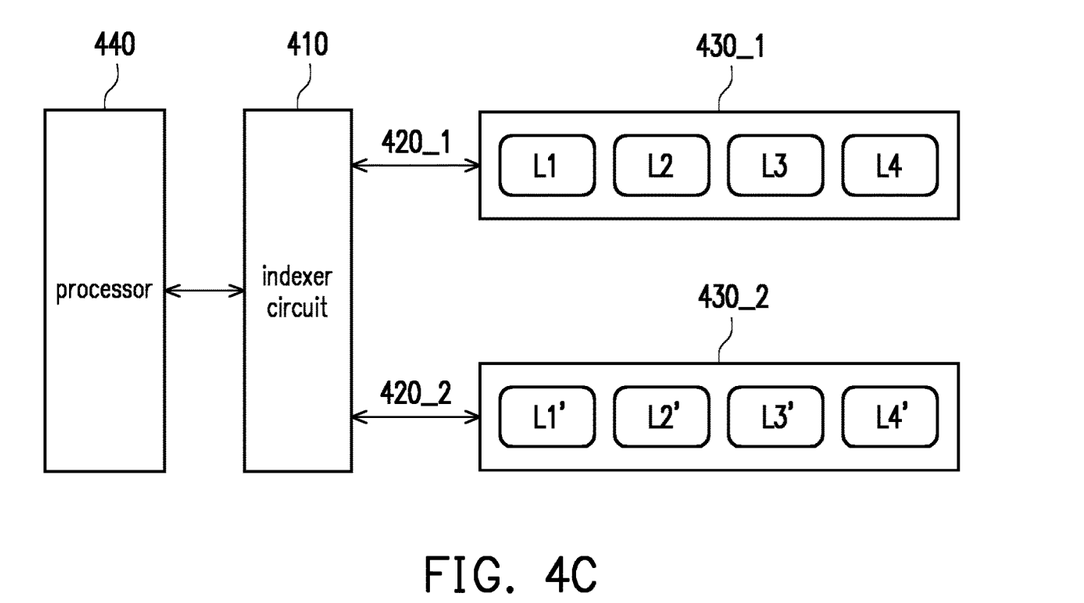
Figure 4D:
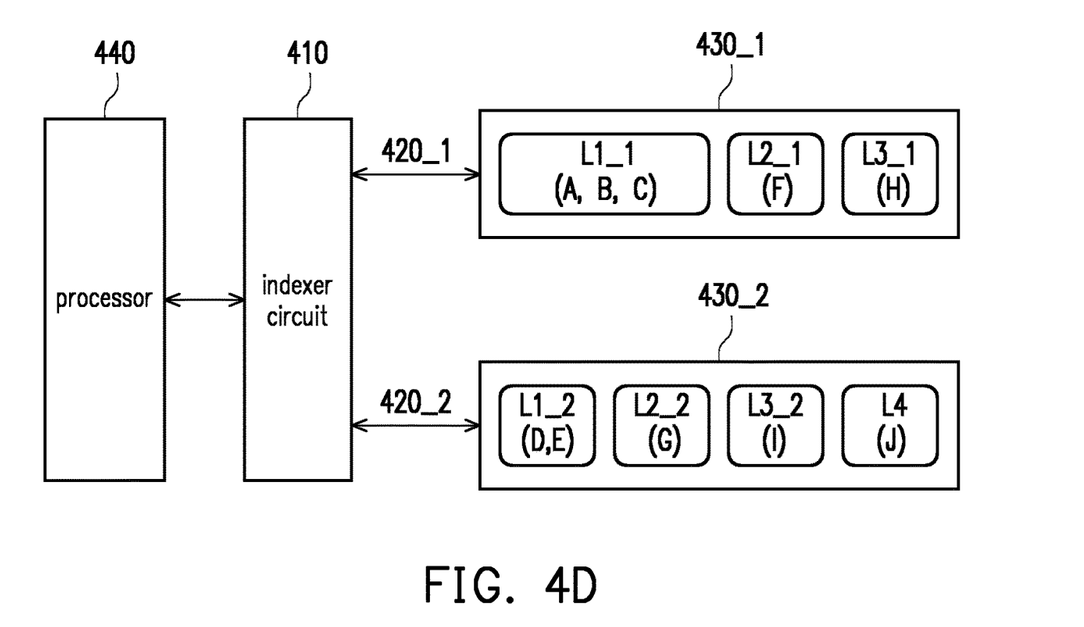

The computing device shown in FIGS. 4B to 4D includes the processor 440, an indexer circuit 410, the memory 430_1, and the memory 430_2. The processor 440 is coupled to the indexer circuit 410, and the indexer circuit 410 may be separately coupled to the memories 430_1 and 430_2 through the memory channels 420_1 and 420_2. The indexer circuit 410, the memory channels 420_1 and 420_2, and the memories 430_1 and 430_2 shown in FIGS. 4B to 4D may be analogized by referring to the relevant descriptions of the indexer circuit 110, the memory channels 120_1 to 120_n, and the memories 130_1 to 130_n shown in FIG. 1, or the processor 440, the indexer circuit 410, the memory channels 420_1 and 420_2, and the memories 430_1 and 430_2 shown in FIGS. 4B to 4D may be analogized by referring to the relevant descriptions of the processor 340, the indexer circuit 310, the memory channels 320_1 to 320_n, and the memories 330_1 to 330_n shown in FIG. 3, so there will be no reiteration here.

In order to balance the transmission load of the memory channels 420_1 and 420_2, in the embodiment shown in FIGS. 4B to 4D, the indexer circuit 410 considers the transmission bandwidth of the memory channels 420_1 and 420_2. The example shown in FIG. 4B will continue the assumptions of the example shown in FIG. 4A, but consider the transmission bandwidth of the memory channels 420_1 and 420_2. That is, the indexer circuit 410 may determine the arrangement of the lookup tables to the memories 430_1 and 430_2 according to the characteristics of the lookup tables and the transmission bandwidth of the memory channels 420_1 and 420_2. The indexer circuit 410 may evenly distribute the total number of table lookup times of the lookup tables L1 to L4 to the two memory channels 420_1 and 420_2 as much as possible. For example, the indexer circuit 410 may arrange the lookup table L1 to the memory 430_1 and the lookup tables L2 to L4 to the memory 430_2. Therefore, the indexer circuit 410 needs to read the memory 430_1 40 times (which costs 40 units of time), and needs to read the memory 430_2 40 times (which costs 40 units of time). Since the indexer circuit 410 may read the memory 430_1 and the memory 430_2 at the same time, the indexer circuit 410 only needs 40 units of time to complete the lookup (access) operation of the lookup tables L1 to L4. Compared with the example shown in FIG. 4A, the lookup (access) operation of the example shown in FIG. 4B is faster.

In the embodiment shown in FIG. 4C, the processor 440 or the indexer circuit 410 may know the read probability of each part of four lookup tables (Table 1, Table 2, Table 3, and Table 4) according to the algorithm and/or historical records. For example, the processor 440 may transmit the read probability of Table 1 to Table 4 to the indexer circuit 410 in advance. The indexer circuit 410 may split each of Table 1 to Table 4 into two parts L1 and L1' (the probability of being looked up for each part is 50%) according to the probability of being looked up for each part of Table 1 to Table 4. Then, the indexer circuit 410 may separately arrange the two parts L1 and L1' of Table 1 to the memories 430_1 and 430_2. By analogy, parts L2, L3, and L4 of Table 2 to Table 4 are arranged to the memory 430_1, and other parts L2', L3', and L4' of Table 2 to Table 4 are arranged to the memory 430_2. Even if the processor 440 only knows the probability that Table 1 to Table 4 need to be read and does not know the actual number of times Table 1 to Table 4 need to be read, the indexer circuit 410 may evenly distribute the lookup (access) actions to the memory channels 420_1 and 420_2 as much as possible.

Therefore, the embodiment shown in FIG. 4C may balance the transmission load of the memory channels 420_1 and 420_2 to improve the table lookup speed.

Please refer to FIG. 4A. For example, it is assumed that the lookup tables that need to be accessed include the lookup tables L1, L2, L3, and L4. It is further assumed that when the computing device is working, according to the content of the algorithm, it is known that 5 sets of data (A, B, C, D, and E) need to be read from the lookup table L1, 2 sets of data (F and G) need to be read from the lookup table L2, 2 sets of data (H and I) need to be read from the lookup table L3, and 1 set of data (J) needs to be read from the lookup table L4. It is also assumed that the time required for lookup (access) by the indexer circuit 410 is 1 unit each time.

Without considering the transmission bandwidth of the memory channels 420_1 and 420_2, it is assumed that the lookup table L1 and the lookup table L2 are placed in the memory 430_1, and the lookup table L3 and the lookup table L4 are placed in the memory 430_2. Therefore, the indexer circuit 410 needs to read the memory 430_1 7 times (which costs 7 units of time to read data A, B, C, D, E, F, and G), and needs to read the memory 430_2 3 times (which costs 3 units of time to read data H, I, and J). Since the indexer circuit 410 may read the memory 430_1 and the memory 430_2 at the same time, the indexer circuit 410 needs 7 units of time to complete the lookup (access) operation of the lookup tables L1 to L4. Without considering the transmission bandwidth of the memory channels 420_1 and 420_2, the transmission load of the memory channels 420_1 and 420_2 is not balanced, so the memory 430_1 and the memory channel 420_1 become performance bottlenecks.

In order to balance the transmission load of the memory channels 420_1 and 420_2, in the embodiment shown in FIG. 4D, the indexer circuit 410 considers the transmission bandwidth of the memory channels 420_1 and 420_2. The example shown in FIG. 4D will continue the assumptions of the example described in the foregoing paragraph, but consider the transmission bandwidth of the memory channels 420_1 and 420_2. The indexer circuit 410 may evenly distribute the lookup (access) actions of the lookup tables L1 to L4 to the memory channels 420_1 and 420_2 as much as possible. For example, the indexer circuit 410 may arrange the data A, B, and C (that is, a part L1_1 of the lookup table shown in FIG. 4D) of the lookup table L1 to the memory 430_1, arrange the data D and E (that is, a part L1_2 of the lookup table shown in FIG. 4D) of the lookup table L1 to the memory 430_2, arrange the data F (that is, a part L2_1 of the lookup table shown in FIG. 4D) of the lookup table L2 to the memory 430_1, arrange the data G (that is, a part L2_2 of the lookup table shown in FIG. 4D) of the lookup table L2 to the memory 430_2, arrange the data H (that is, a part L3_1 of the lookup table shown in FIG. 4D) of the lookup table L3 to the memory 430_1, arrange the data I (that is, a part L3_2 of the lookup table shown FIG. 4D) of the lookup table L3 to the memory 430_2, and arrange the data J of the lookup table L4 to the memory 430_2. Therefore, the indexer circuit 410 needs to read the memory 430_1 5 times (which costs 5 units of time to read the data A, B, C, F, and H), and needs to read the memory 430_2 5 times (which costs 5 units of time to read the data D, E, G, I, and J). Since the indexer circuit 410 may read the memory 430_1 and the memory 430_2 at the same time, the indexer circuit 410 only needs 5 units of time to complete the lookup (access) operation of the lookup tables L1 to L4. Compared with the example described in the foregoing paragraph, the lookup (access) operation of the example shown in FIG. 4D is faster.

In summary, in some embodiments, the processor 440 may determine the arrangement of the lookup tables L1 to L4 to at least one of the memories 430_1 and 430_2 according to the characteristic of at least one lookup table and the transmission bandwidth of the memory channels 420_1 and 420_2 through the indexer circuit 410. According to the determined arrangement, the indexer circuit 410 may selectively and evenly distribute multiple parts of the lookup table or the lookup table with frequent lookup times, high lookup probability, or large amount of data returned to the independent memory 430_1 and memory 430_2 through the memory channels 420_1 and 420_2, so as to maximize the utilization of the transmission bandwidth of the memory channels 420_1 and 420_2, and balance the transmission load of the memory channels 420_1 and 420_2 as much as possible. As such, the table lookup time of the processor 440 waiting for the lookup table data during the calculation process may be reduced, thereby achieving the optimization of the performance of the computing device.

Although the disclosure has been disclosed in the above embodiments, the above embodiments are not intended to limit the disclosure. Persons skilled in the art may make some changes and modifications without departing from the spirit and scope of the disclosure. Therefore, the protection scope of the disclosure shall be defined by the scope of the appended claims.

What is claimed is:

1. A computing device, comprising:
   a plurality of memories; and
   an indexer circuit, separately coupled to the plurality of memories through a plurality of memory channels, wherein
   the indexer circuit determines an arrangement of at least one lookup table to at least one of the plurality of memories according to a characteristic of the at least one lookup table and a transmission bandwidth of the plurality of memory channels, so as to balance a transmission load of the plurality of memory channels, wherein the transmission bandwidth of the plurality of memory channels represents a rate of data transmission in the plurality of memory channels, and the plurality of memory channels are data paths excluding each respective storage space of the plurality of memories.

2. The computing device according to claim 1, wherein the arrangement comprises that the indexer circuit stores each of the at least one lookup table to a corresponding memory in the plurality of memories according to the characteristic of the at least one lookup table and the transmission bandwidth of the plurality of memory channels, so as to balance the transmission load of the plurality of memory channels.

3. The computing device according to claim 1, wherein one lookup table of the at least one lookup table is divided into a plurality of parts, and the arrangement comprises that the indexer circuit separately stores the plurality of parts to different memories in the plurality of memories according to the characteristic of the plurality of parts and the transmission bandwidth of the plurality of memory channels, so as to balance the transmission load of the plurality of memory channels.

4. The computing device according to claim 1, wherein the arrangement comprises that the indexer circuit copies and stores the at least one lookup table to different memories in the plurality of memories according to the characteristic of the at least one lookup table and the transmission bandwidth of the plurality of memory channels, so as to balance the transmission load of the plurality of memory channels.

5. The computing device according to claim 1, wherein the characteristic of the at least one lookup table comprises at least one of a read count, a read probability, and an amount of data returned of the at least one lookup table.

6. The computing device according to claim 1, wherein the indexer circuit comprises:
   a routing circuit, separately coupled to the plurality of memories through the plurality of memory channels;
   a lookup table characteristic recorder, configured to provide information corresponding to the characteristic of the at least one lookup table; and
   a data distribution and loading device, coupled to the lookup table characteristic recorder to receive the information and coupled to the routing circuit, and configured to control the routing circuit according to the information, so as to arrange the at least one lookup table to the plurality of memories through the routing circuit.

7. The computing device according to claim 6, wherein the indexer circuit further comprises:
   a lookup table position recorder, coupled to the data distribution and loading device, and configured to record an arrangement result regarding the data distribution and loading device arranging the at least one lookup table to the plurality of memories.

8. The computing device according to claim 1, wherein the indexer circuit comprises:
   a routing circuit, separately coupled to the plurality of memories through the plurality of memory channels;
   a lookup table position recorder, configured to provide an arrangement result regarding the indexer circuit arranging the at least one lookup table to the plurality of memories; and
   a position decoder, coupled to the lookup table position recorder to obtain the arrangement result and coupled to the routing circuit, and configured to control the routing circuit according to the arrangement result, so as to look up the at least one lookup table arranged to the plurality of memories through the routing circuit, thereby obtaining a table lookup result.

9. The computing device according to claim 8, wherein the indexer circuit further comprises:
   a table lookup result register, coupled to the routing circuit and configured to temporarily store the table lookup result.

10. The computing device according to claim 1, further comprising:
    a processor, coupled to the indexer circuit, wherein
    in a first mode, the processor provides the characteristic of the at least one lookup table to the indexer circuit; and
    in a second mode, the processor sends a table lookup request to the indexer circuit, and reads a table lookup result from the indexer circuit.

11. The computing device according to claim 10, wherein the indexer circuit comprises:
    a lookup table characteristic recorder, configured to record the characteristic of the at least one lookup table.

12. An operation method of a computing device, comprising:
    determining, by an indexer circuit, an arrangement according to a characteristic of at least one lookup table and a transmission bandwidth of a plurality of memory channels, wherein the indexer circuit is separately coupled to a plurality of memories through the plurality of memory channels; and
    arranging, by the indexer circuit, the at least one lookup table to at least one of the plurality of memories according to the arrangement, so as to balance a transmission load of the plurality of memory channels, wherein the transmission bandwidth of the plurality of memory channels represents a rate of data transmission in the plurality of memory channels, and the plurality of memory channels are data paths excluding each respective storage space of the plurality of memories.

13. The operation method according to claim 12, wherein the arrangement comprises:
storing, by the indexer circuit, each of the at least one lookup table to a corresponding memory in the plurality of memories according to the characteristic of the at least one lookup table and the transmission bandwidth of the plurality of memory channels, so as to balance the transmission load of the plurality of memory channels.

14. The operation method according to claim 12, wherein one lookup table of the at least one lookup table is divided into a plurality of parts, and the arrangement comprises:
separately storing, by the indexer circuit, the plurality of parts to different memories in the plurality of memories according to the characteristic of the plurality of parts and the transmission bandwidth of the plurality of memory channels, so as to balance the transmission load of the plurality of memory channels.

15. The operation method according to claim 12, wherein the arrangement comprises:
copying and storing, by the indexer circuit, the at least one lookup table to different memories in the plurality of memories according to the characteristic of the at least one lookup table and the transmission bandwidth of the plurality of memory channels, so as to balance the transmission load of the plurality of memory channels.

16. The operation method according to claim 12, wherein the characteristic of the at least one lookup table comprises at least one of a read count, a read probability, and an amount of data returned of the at least one lookup table.

17. The operation method according to claim 12, further comprising:
providing, by a lookup table characteristic recorder of the indexer circuit information, information corresponding to the characteristic of the at least one lookup table; and
arranging, by a data distribution and loading device of the indexer circuit, the at least one lookup table to the plurality of memories according to the information through a routing circuit of the indexer circuit, wherein the routing circuit is separately coupled to the plurality of memories through the plurality of memory channels.

18. The operation method according to claim 17, further comprising:
recording, by a lookup table position recorder of the indexer circuit, an arrangement result regarding the data distribution and loading device arranging the at least one lookup table to the plurality of memories.

19. The operation method according to claim 12, further comprising:
providing, by a lookup table position recorder of the indexer circuit, an arrangement result regarding the indexer circuit arranging the at least one lookup table to the plurality of memories; and
looking up, by a position decoder of the indexer circuit, the at least one lookup table arranged to the plurality of memories according to the arrangement result through a routing circuit of the indexer circuit, so as to obtain a table lookup result, wherein the routing circuit is separately coupled to the plurality of memories through the plurality of memory channels.

20. The operation method according to claim 19, further comprising:
temporarily storing, by a table lookup result register, the table lookup result.

21. The operation method according to claim 12, further comprising:
providing, by a processor in a first mode, the characteristic of the at least one lookup table to the indexer circuit; and
sending, by the processor in a second mode, a table lookup request to the indexer circuit, and reading a table lookup result from the indexer circuit.

22. The operation method according to claim 21, further comprising:
recording, by a lookup table characteristic recorder of the indexer circuit, the characteristic of the at least one lookup table.

\* \* \* \* \*